United States Patent
Dhanasekaran

(10) Patent No.: US 9,438,189 B2
(45) Date of Patent: Sep. 6, 2016

(54) LOW VOLTAGE MULTI-STAGE AMPLIFIER

(71) Applicant: QUALCOMM Incorporated, San Diego, CA (US)

(72) Inventor: Vijayakumar Dhanasekaran, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 5 days.

(21) Appl. No.: 13/793,933

(22) Filed: Mar. 11, 2013

(65) Prior Publication Data

US 2014/0028397 A1 Jan. 30, 2014

Related U.S. Application Data

(60) Provisional application No. 61/676,083, filed on Jul. 26, 2012.

(51) Int. Cl.
*H03F 1/22* (2006.01)
*H03F 3/45* (2006.01)
(Continued)

(52) U.S. Cl.
CPC ........ *H03F 3/45179* (2013.01); *H03F 1/0261* (2013.01); *H03F 3/211* (2013.01); *H03F 3/3022* (2013.01); *H03F 3/345* (2013.01); *H03F 1/22* (2013.01); *H03F 1/223* (2013.01); *H03F 2200/405* (2013.01); *H03F 2200/408* (2013.01); *H03F 2200/453* (2013.01); *H03F 2200/456* (2013.01); *H03F 2200/61* (2013.01)

(58) Field of Classification Search
CPC .. H03F 3/2171; H03F 3/45179; H03F 3/193; H03F 3/21; H03F 1/02; H03F 1/0205; H03F 1/0211; H03F 1/0222; H03F 1/0227; H03F 1/223; H03F 1/3241; H03F 2200/408; H03F 2200/513; H03F 3/185; H03F 1/0261; H03F 1/30; H03F 1/305; H03F 2003/45008; H03F 2200/451; H03F 3/45273; H03F 3/3022; H03F 3/45475; H03F 3/45183; H03F 2200/61; H03F 3/45
USPC ......... 330/98, 253, 255, 257, 259, 260, 261, 330/296, 310, 311
See application file for complete search history.

(56) References Cited

U.S. PATENT DOCUMENTS 6,724,252 B2   4/2004   Ngo et al.
6,937,102 B2   8/2005   Lopez et al.
(Continued)

FOREIGN PATENT DOCUMENTS

WO   WO-2008091325 A1   7/2008

OTHER PUBLICATIONS

De Langen K.J., et al., "Compact Low-Voltage Power-Efficient Operational Amplifier Cells for VLSI", IEEE Journal of Solid-State Circuits, vol. 33, No. 10, Oct. 1998, pp. 1482-1496.

(Continued)

*Primary Examiner* — Khanh V Nguyen
(74) *Attorney, Agent, or Firm* — Liberty E. Mann

(57) ABSTRACT

A low voltage multi-stage amplifier is described. The low voltage multi-stage amplifier includes one or more prior stages. The low voltage multi-stage amplifier also includes a supply stage. The low voltage multi-stage amplifier further includes an output stage that operates with a supply voltage as low as a sum of a threshold voltage of a first transistor in the output stage and a saturation voltage of a second transistor of the supply stage. The supply stage supplies the output stage.

40 Claims, 8 Drawing Sheets

(51) Int. Cl.
   *H03F 1/02*   (2006.01)
   *H03F 3/21*   (2006.01)
   *H03F 3/30*   (2006.01)
   *H03F 3/345*  (2006.01)

(56) References Cited

U.S. PATENT DOCUMENTS

| | | | |
|---|---|---|---|
| 7,012,465 B2 | 3/2006 | Manetakis | |
| 7,193,459 B1 | 3/2007 | Epperson et al. | |
| 7,346,318 B2 | 3/2008 | Tsutsui et al. | |
| 7,348,841 B2 | 3/2008 | Kim et al. | |
| 7,557,658 B2* | 7/2009 | Perez | 330/255 |
| 8,081,777 B2 | 12/2011 | North | |
| 2010/0033464 A1* | 2/2010 | Shimatani | 330/257 |
| 2010/0182087 A1* | 7/2010 | Hellums | 330/253 |
| 2011/0007058 A1* | 1/2011 | Hisano | 330/257 |
| 2014/0167860 A1* | 6/2014 | Dhanasekaran | 330/310 |

OTHER PUBLICATIONS

Dhanasekaran, et al., "Design of Three-Stage Class-AB 16 Ω Headphone Driver Capable of Handling Wide Range of Load Capacitance," IEEE Journal of Solid-State Circuits, vol. 44, No. 6, Jun. 2009, pp. 1734-1744.
Gambhir, et al., "Low-Power Architecture and Circuit Techniques for High-Boost Wide-Band Gm-C Filters," IEEE Transactions on Circuits and Systems—I: Regular Papers, vol. 54, No. 3, Mar. 2007, pp. 458-468.
Lollio, et al., "A Class-G Headphone Amplifier in 65 nm CMOS Technology," IEEE Journal of Solid-State Circuits, vol. 45, No. 12, Dec. 2010, pp. 2530-2542.
International Search Report and Written Opinion—PCT/US2013/052405—ISA/EPO—Oct. 16, 2013.

* cited by examiner

LOW VOLTAGE MULTI-STAGE AMPLIFIER

CLAIM OF PRIORITY UNDER 35 U.S.C. §119

The present application for patent claims priority to Provisional Application No. 61/676,083 entitled "LOW VOLTAGE CLASS-AB OPAMP" filed Jul. 26, 2012, and assigned to the assignee hereof and hereby expressly incorporated by reference herein.

TECHNICAL FIELD

The present disclosure relates generally to electronic communications. More specifically, the present disclosure relates to systems and methods for a low voltage multi-stage amplifier.

BACKGROUND

Wireless communication systems are widely deployed to provide various types of communication content such as voice, video, data, and so on. These systems may be multiple-access systems capable of supporting simultaneous communication of multiple wireless communication devices with one or more base stations.

Wireless communication devices are typically powered by batteries. As the functionality of wireless communication devices becomes more complicated, so has the desire for wireless communication devices to maximize battery life. By reducing the power consumption of a wireless communication device, the battery life may be increased. One way to reduce power consumption is to use more efficient amplifiers within wireless communication devices. For example, amplifiers that use lower supply voltages may be more efficient than amplifiers that use higher supply voltages. Benefits may be realized by an amplifier that uses lower supply voltages while still providing the necessary gains.

SUMMARY

A low voltage multi-stage amplifier is described. The low voltage multi-stage amplifier includes multiple prior stages. The low voltage multi-stage amplifier also includes a supply stage. The low voltage multi-stage amplifier further includes an output stage that operates with a supply voltage as low as a sum of a threshold voltage of a first transistor in the output stage and a saturation voltage of a second transistor of the supply stage. The supply stage supplies the output stage.

The supply stage may also operate as a damping stage. The low voltage multi-stage amplifier may also include biasing circuitry that sets quiescent current for proper operation of the output stage via the supply stage. The biasing circuitry may include a replica current stage, a minimum selector and an error amplifier. The replica current stage may provide a first bias voltage and a second bias voltage to the minimum selector. The minimum selector may provide a determined voltage to the error amplifier. The error amplifier may control the supply stage that sets a quiescent current of the output stage.

The determined voltage may be an average of the first bias voltage and the second bias voltage if the first bias voltage and the second bias voltage are within a minimum selector transistor saturation voltage of each other. The determined voltage may be the smaller of the first bias voltage and the second bias voltage if the first bias voltage and the second bias voltage are not within the minimum selector transistor saturation voltage of each other. The error amplifier may output a first control voltage and a second control voltage to the supply stage.

The first transistor may be a p-channel transistor and the second transistor may be an n-channel transistor. A source of the first transistor may be coupled to a variable positive supply voltage. A gate of the first transistor may be coupled to a drain of the second transistor. A source of the second transistor may be coupled to a variable negative supply voltage.

The multiple prior stages may include a first stage and a second stage. The first stage may receive an input signal. An output of the first stage may be coupled to the second stage. An output of the second stage may be coupled to the output stage. The output stage may output an output signal. Additional bias current may not be needed to support the supply stage since current in the second stage is recycled. The low voltage multi-stage amplifier may be a class-G amplifier or a class-H amplifier. The low voltage multi-stage amplifier may be configured to match supply voltages of the output stage to an output signal of the output stage. The output stage may operate with supply voltages of +/−0.45 volts.

A method for amplification is also described. An input signal is obtained. The input signal is amplified using a low voltage multi-stage amplifier. The low voltage multi-stage amplifier includes multiple prior stages. The low voltage multi-stage amplifier also includes a supply stage. The low voltage multi-stage amplifier further includes an output stage that operates with a supply voltage as low as a sum of a threshold voltage of a first transistor in the output stage and a saturation voltage of a second transistor of the supply stage. The supply stage supplies the output stage.

An apparatus is described. The apparatus includes means for obtaining an input signal. The apparatus also includes means for amplifying the input signal that include multiple prior stages, a supply stage and an output stage that operates with a supply voltage as low as a sum of a threshold voltage of a first transistor in the output stage and a saturation voltage of a second transistor of the supply stage. The supply stage supplies the output stage.

A computer-program product configured for amplifying an input signal is also described. The computer-program product includes a non-transitory computer-readable medium having instructions thereon. The instructions include code for causing a low voltage multi-stage amplifier to obtain an input signal. The instructions also include code for causing the low voltage multi-stage amplifier to amplify the input signal. The low voltage multi-stage amplifier includes multiple prior stages, a supply stage and an output stage that operates with a supply voltage as low as a sum of a threshold voltage of a first transistor in the output stage and a saturation voltage of a second transistor of the supply stage. The supply stage supplies the output stage.

DETAILED DESCRIPTION

Figure 1:
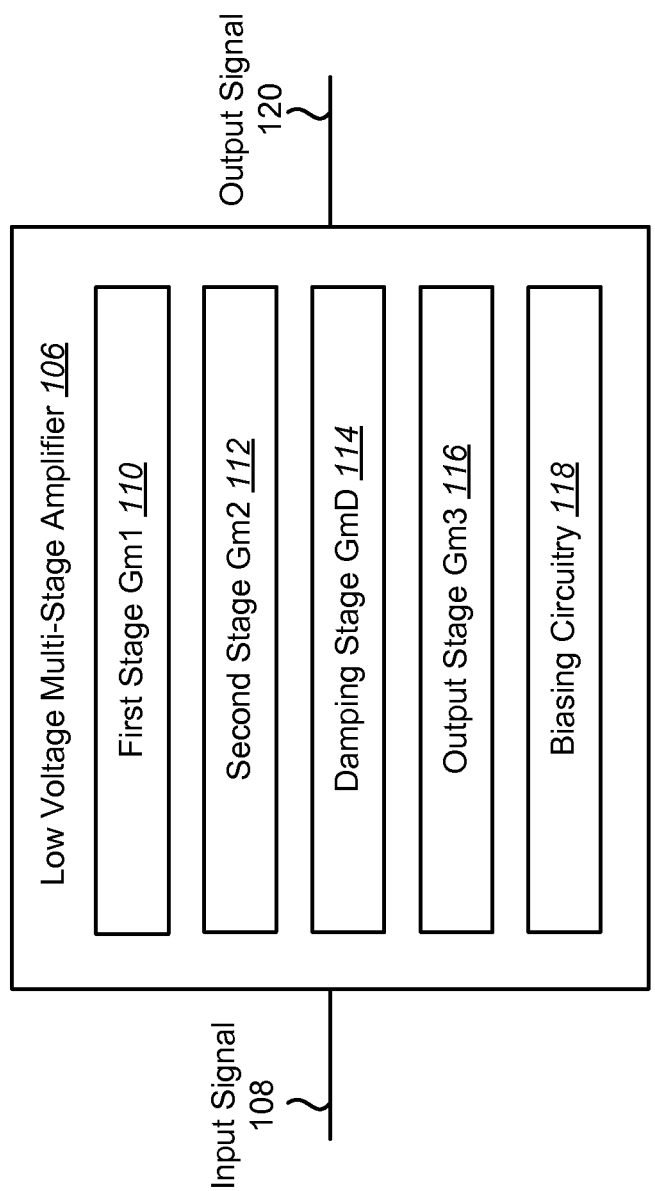
FIG. 1 is a block diagram illustrating a low voltage multi-stage amplifier.

FIG. 1 is a block diagram illustrating a low voltage multi-stage amplifier 106. The low voltage multi-stage amplifier 106 may be a class-AB amplifier, a class G amplifier, a class H amplifier, a rail switching amplifier, or an amplifier with an infinitely variable supply rail. The low voltage multi-stage amplifier 106 may be an op-amp, a power amplifier or a distribution amplifier. By adjusting power supply rails in an amplifier 106, the power consumption of the amplifier 106 may be reduced (since the power supply rails are only providing the minimum amount of voltage required for input signals to avoid distortion).

The low voltage multi-stage amplifier 106 may include multiple amplification stages. For example, the low voltage multi-stage amplifier 106 may include a first stage Gm1 110, a second stage Gm2 112, a damping stage GmD 114 and an output stage Gm3 116. The multiple amplification stages may allow the low voltage multi-stage amplifier 106 to amplify an input signal 108 and generate an amplified output signal 120 with minimal distortion and minimal power consumption. The first stage Gm1 110 may be a telescopic amplifier.

Class-B amplifiers may amplify only half of the wave cycle of an input signal 108. At the expense of increased distortion, class-B amplifiers have high efficiency (because the amplifying element of a class-B amplifier is switched off half the time), resulting in reduced power consumption. By using complementary pairs, multiple class-B amplifiers may be used to amplify both halves of an input signal, thereby reducing the distortion. However, complementary pairs of class-B amplifiers may suffer from crossover distortion, where increased distortion is experienced when one of the class-B amplifiers is turning off and another class-B amplifier is turning on.

One way to eliminate crossover distortion is the use of class-AB amplifiers. In class-AB amplifiers, each device may amplify half of the signal and conduct a small amount during the other half (rather than shutting off). The amount of distortion is dependent on the standing current through both devices when there is no signal (referred to as the quiescent current). The quiescent current is directly dependent on the bias voltage. A class-AB amplifier has a lower efficiency than a class-B amplifier but has increased linearity.

Class-G and class-H amplifiers enhance class-AB output stages by obtaining increased efficiency without increasing the distortion. In class-G amplifiers, rail switching is used to increase the efficiency. In rail switching, different supply voltages may be used to accommodate the swings in the output signal 120. Typically, rail switching is used in the output stage Gm3 116, since the output stage Gm3 116 experiences the largest output current and can thus obtain the largest increases in efficiency. For class-G amplifiers, multiple discrete supply voltages may be used. For class-H amplifiers, infinitely variable supply voltages may be used (by matching the supply voltage to the output signal 120). Matching the supply voltage to the output signal 120 may sometimes be referred to as envelope tracking.

The low voltage multi-stage amplifier 106 may include biasing circuitry 118. The biasing circuitry 118 may set the quiescent current of the output stage Gm3 116, thereby supplying the minimum headroom required for proper operation of the output stage Gm3 116. The biasing circuitry 118 may provide control voltages to the output stage Gm3 116 through the damping stage GmD 114 that are dependent on the output signal 120, allowing the output stage Gm3 116 to operate with minimal supply voltage (operation down to +/−0.45 volts (V)). By operating the output stage Gm3 116 with the minimal supply voltage, the power consumption of the low voltage multi-stage amplifier 106 may be reduced.

Figure 2:
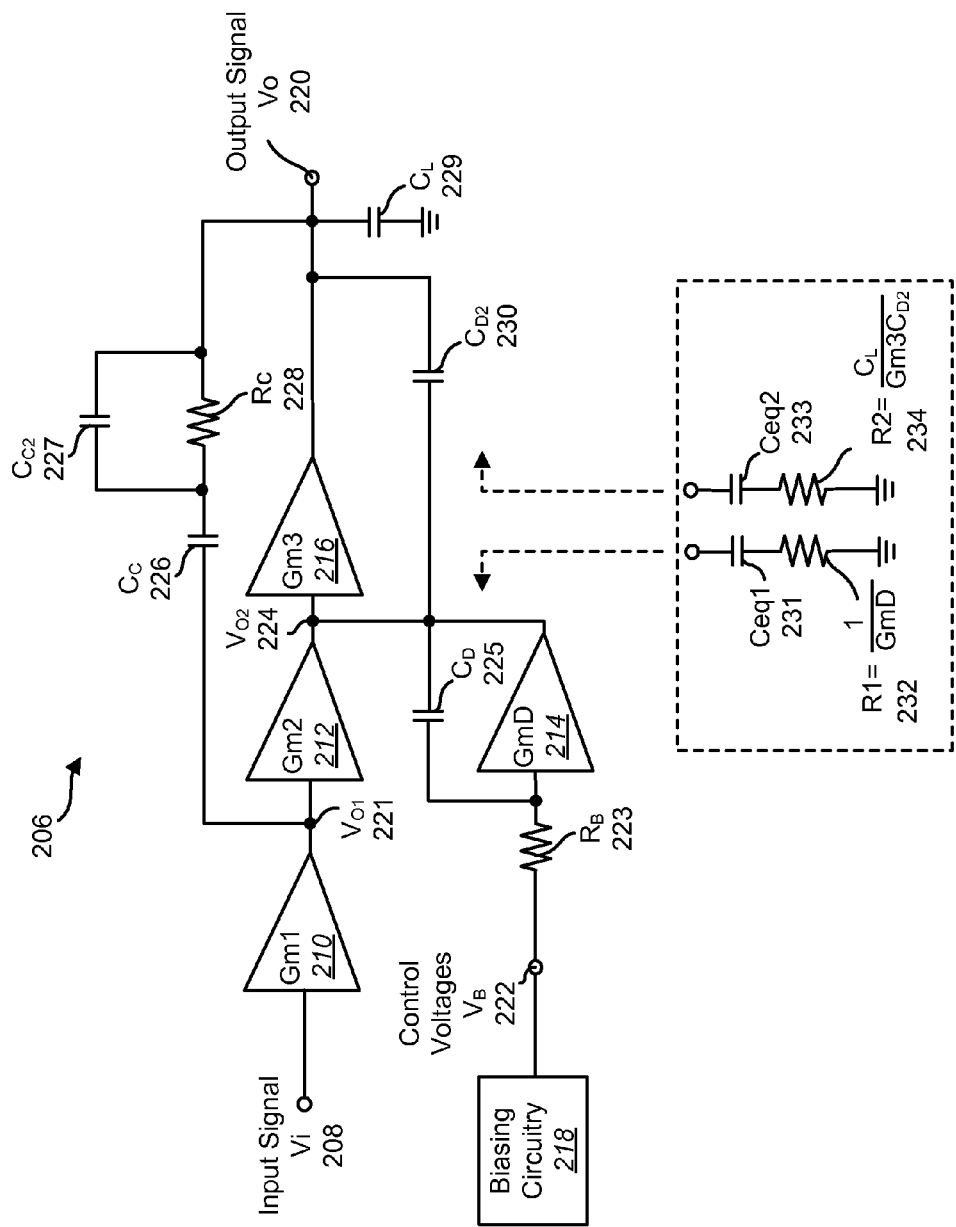
FIG. 2 is a block diagram illustrating a low voltage multi-stage amplifier for use in the present systems and methods.

FIG. 2 is a block diagram illustrating a low voltage multi-stage amplifier 206 for use in the present systems and methods. The low voltage multi-stage amplifier 206 of FIG. 2 may be one configuration of the low-voltage multi-stage amplifier 106 of FIG. 1. The low voltage multi-stage amplifier 206 may include biasing circuitry 218, a first stage Gm1 210, a second stage Gm2 212, a damping stage GmD 214 and an output stage Gm3 216. The first stage Gm1 210 may receive an input signal Vi 208 and output a voltage VO1 221. The voltage VO1 221 may be provided to the input of the second stage Gm2 212. The second stage Gm2 212 may output a voltage VO2 224. The voltage VO2 224 may be provided to an input of the output stage Gm3 216. The output stage Gm3 216 may output an output signal VO 220. The output of the output stage Gm3 216 may be coupled to ground via a load capacitor CL 229.

The output of the first stage Gm1 210 may also be coupled to a capacitor CC 226. The capacitor CC 226 may be coupled to both a resistor Rc 228 and a capacitor Cc2 227 in parallel. The resistor Rc 228 and the capacitor Cc2 227 may be coupled to the output of the output stage Gm3 216.

The output of the second stage Gm2 212 may also be coupled to the output of the output stage Gm3 216 via a capacitor CD2 230. The output of the second stage Gm2 212 may further be coupled to an output of the damping stage GmD 214. The output of the second stage Gm2 212 may also be coupled to an input of the damping stage GmD 214 via a capacitor CD 225.

The biasing circuitry 218 may output control voltages VB 222. The output of the biasing circuitry 218 may be coupled to the input of the damping stage GmD 214 via a resistor RB 223. Additional feedback (not shown) to the biasing circuitry 218 may also be used to facilitate the generation of the proper control voltages VB 222. As discussed above, the control voltages VB 222 passed through the resistor RB 223 and the damping stage GmD 214 may generate the proper quiescent current needed for operation of the output stage Gm3 216.

The impedance from the output of the damping stage GmD 214 towards the damping stage GmD 214 may be approximated by a capacitor Ceq1 231 coupled to a resistor $$R1 = \frac{1}{GmD} 232$$

that is coupled to the negative supply voltage. The impedance from the output of the damping stage GmD 214 towards the output of the low voltage multi-stage amplifier 206 may be approximated by a capacitor Ceq2 233 coupled to a resistor $$R2 = \frac{C_L}{Gm3 C_{D2}} 234$$

that is coupled to the negative supply voltage. The damping circuit formed by the damping stage GmD 214, the resistor RB 223 and the capacitor CD 225 emulates a damping resistance of $$R1 \approx \frac{1}{GmD}$$

and an equivalent blocking capacitance of Ceq1 ≈GmD*RB*CD.

Figure 3:
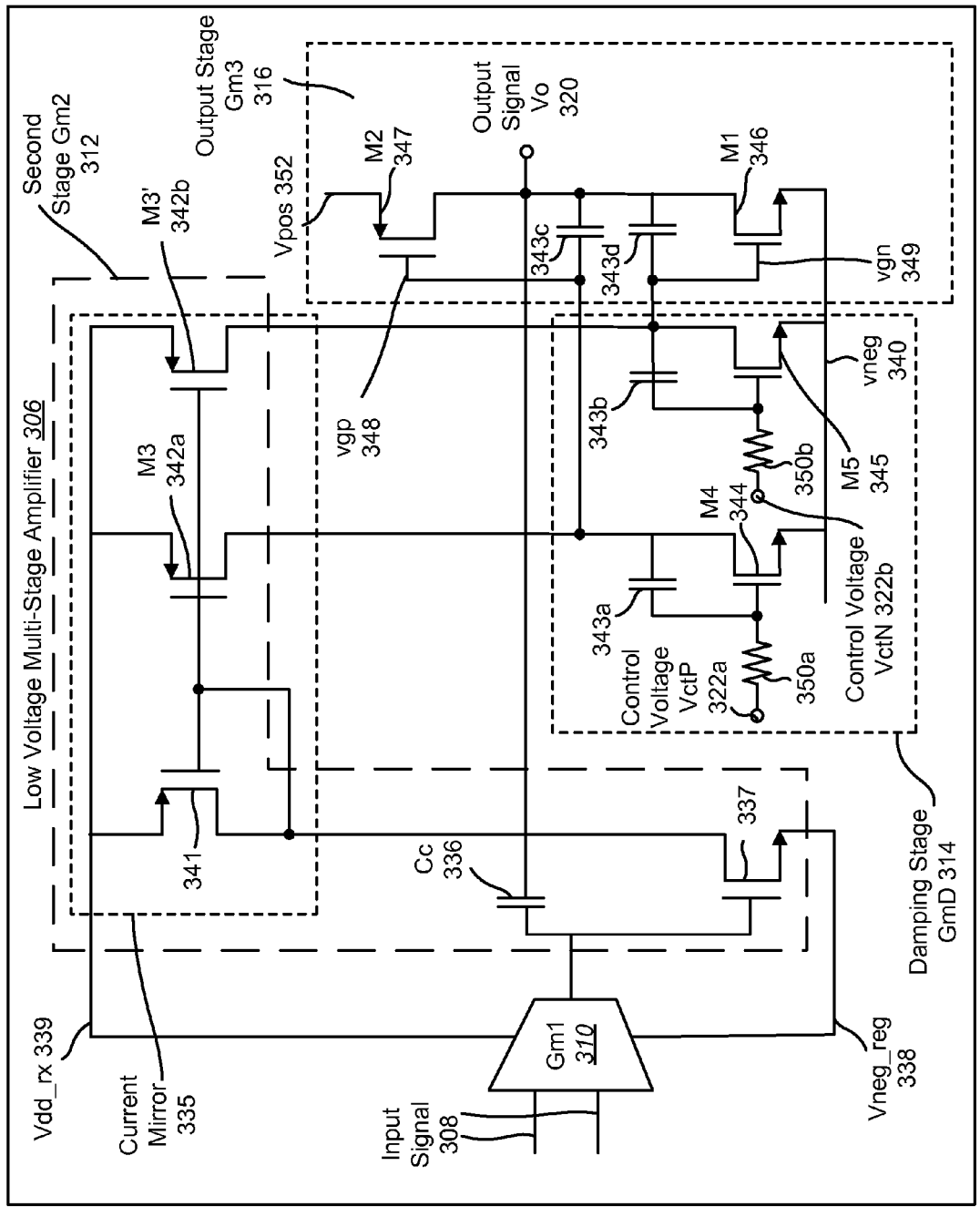
FIG. 3 is a circuit diagram illustrating a low voltage multi-stage amplifier for use in the present systems and methods.

FIG. 3 is a circuit diagram illustrating a low voltage multi-stage amplifier 306 for use in the present systems and methods. The low voltage multi-stage amplifier 306 may include a first stage Gm1 310, a second stage Gm2 312, a damping stage GmD 314, an output stage Gm3 316 and a current mirror 335. The control voltages VctP 322*a* and VctN 322*b* may be provided from biasing circuitry 118.

The first stage Gm1 310 may receive the input signal 308. The first stage Gm1 310 may be coupled to the positive supply voltage Vdd_rx 339 and the negative supply voltage Vneg_reg 338. The positive supply voltage Vdd_rx 339 may be a 1.8 V analog supply (that does not vary according to the output signal 320). The negative supply voltage Vneg_reg 338 may be a fixed small −ve voltage (e.g., −0.3 V). The output of the first stage Gm1 310 may be coupled to the second stage Gm2 312. The current mirror 335 may include a p-channel transistor 341, a p-channel transistor M3 342*a* and a p-channel transistor M3' 342*b*. The source of the p-channel transistor 341 may be coupled to Vdd_rx 339. The gate of the p-channel transistor 341 may be coupled to the drain of the p-channel transistor 341. The drain of the p-channel transistor 341 may also be coupled to the drain of an n-channel transistor 337. The source of the n-channel transistor 337 may be coupled to Vneg_reg 338. The gate of the n-channel transistor 337 may be coupled to the output of the first stage Gm1 310. A capacitor Cc 336 may be coupled between the output of the first stage Gm1 310 and the output signal Vo 320.

The source of the p-channel transistor M3 342*a* and the source of the p-channel transistor M3' 342*b* may each be coupled to Vdd_rx 339. The gate of the p-channel transistor M3 342*a* and the gate of the p-channel transistor M3 ' 342*b* may each be coupled to the gate of the p-channel transistor 341. The second stage Gm2 312 may include the current mirror 335 and the n-channel transistor 337.

The damping stage GmD 314 provides the necessary damping for the low voltage multi-stage amplifier 306. The damping stage GmD 314 may also be reused as a current source for the second stage Gm2 312. The damping stage GmD 314 may also be referred to as a supply stage. The damping stage GmD 314 may include a first resistor 350*a*, a second resistor 350*b*, an n-channel transistor M4 344, an n-channel transistor M5 345, a first capacitor 343*a* and a second capacitor 343*b*. The gate of the n-channel transistor M4 344 may be coupled to the control voltage VctP 322*a* via the first resistor 350*a*. The gate of the n-channel transistor M5 345 may be coupled to the control voltage VctN 322*b* via the second resistor 350*b*. The control voltage VctP 322*a* and the control voltage VctN 322*b* may be provided by the bias circuitry described below in relation to FIG. 4. The control voltage VctP 322*a* through the first resistor 350 and the control voltage VctN 322*b* through the second resistor 350*b* may set the quiescent current needed for proper operation of the output stage Gm3 316.

The drain of the n-channel transistor M4 344 may be coupled to the drain of the p-channel transistor M3 342*a* of the second stage Gm2 312. The drain of the n-channel transistor M4 344 may also be coupled to the gate of the n-channel transistor M4 344 via the first capacitor 343*a*. The source of the n-channel transistor M4 344 may be coupled to a variable negative supply voltage Vneg 340. The drain of the n-channel transistor M5 345 may be coupled to the drain of the p-channel transistor M3' 342*b* of the second stage Gm2 312. The drain of the re-channel transistor M5 345 may also be coupled to the gate of the n-channel transistor M5 345 via the second capacitor 343*b*. The source of the n-channel transistor M5 345 may be coupled to the variable negative supply voltage Vneg 340. No additional bias current is needed to support the damping stage GmD 314, since the current in the second stage Gm2 312 is recycled.

The output stage Gm3 316 may include a p-channel transistor M2 347 and an re-channel transistor M1 346. The source of the p-channel transistor M2 347 may be coupled to a variable positive supply voltage Vpos 352. The drain of the p-channel transistor M2 347 may be coupled to the drain of the n-channel transistor M1 346. The drain of the p-channel transistor M2 347 may also be coupled to the output signal Vo 320. The gate of the p-channel transistor M2 347 may be coupled to the drain of the n-channel transistor M4 344 of the damping stage GmD 314. The gate of the p-channel transistor M2 347 may also be coupled to the output signal Vo 320 via a third capacitor 343*c*. The voltage vgp 348 at the gate of the p-channel transistor M2 347 may be provided to the biasing circuitry 118.

The source of the n-channel transistor M1 346 may be coupled to the variable negative supply voltage Vneg 340. The gate of the n-channel transistor M1 346 may be coupled to the drain of the n-channel transistor M5 345 of the damping stage GmD 314. The gate of the n-channel transistor M1 346 may also be coupled to the output signal Vo 320 via a fourth capacitor 343*d*. The voltage vgn 349 at the gate of the n-channel transistor M1 346 may be provided to the biasing circuitry 118.

The minimum headroom required for proper operation of the low voltage multi-stage amplifier 306 is Vpos−Vneg>Vgs$_{M2}$+Vdsat$_{M4}$, where Vgs$_{M2}$ is the voltage from the gate to the source of the p-channel transistor M2 347 and Vdsat$_{M4}$ is the minimum voltage from the drain to the source of the n-channel transistor M4 344 required to meet saturation operation (and thus prevent the n-channel transistor M4 344 from operating in the triode region). This allows for advanced compensation. The control voltage VctP 322*a* and the control voltage VctN 322*b* ensure proper operation of the low voltage configuration formed by M1 346, M2 347 and M4 344.

Figure 4:
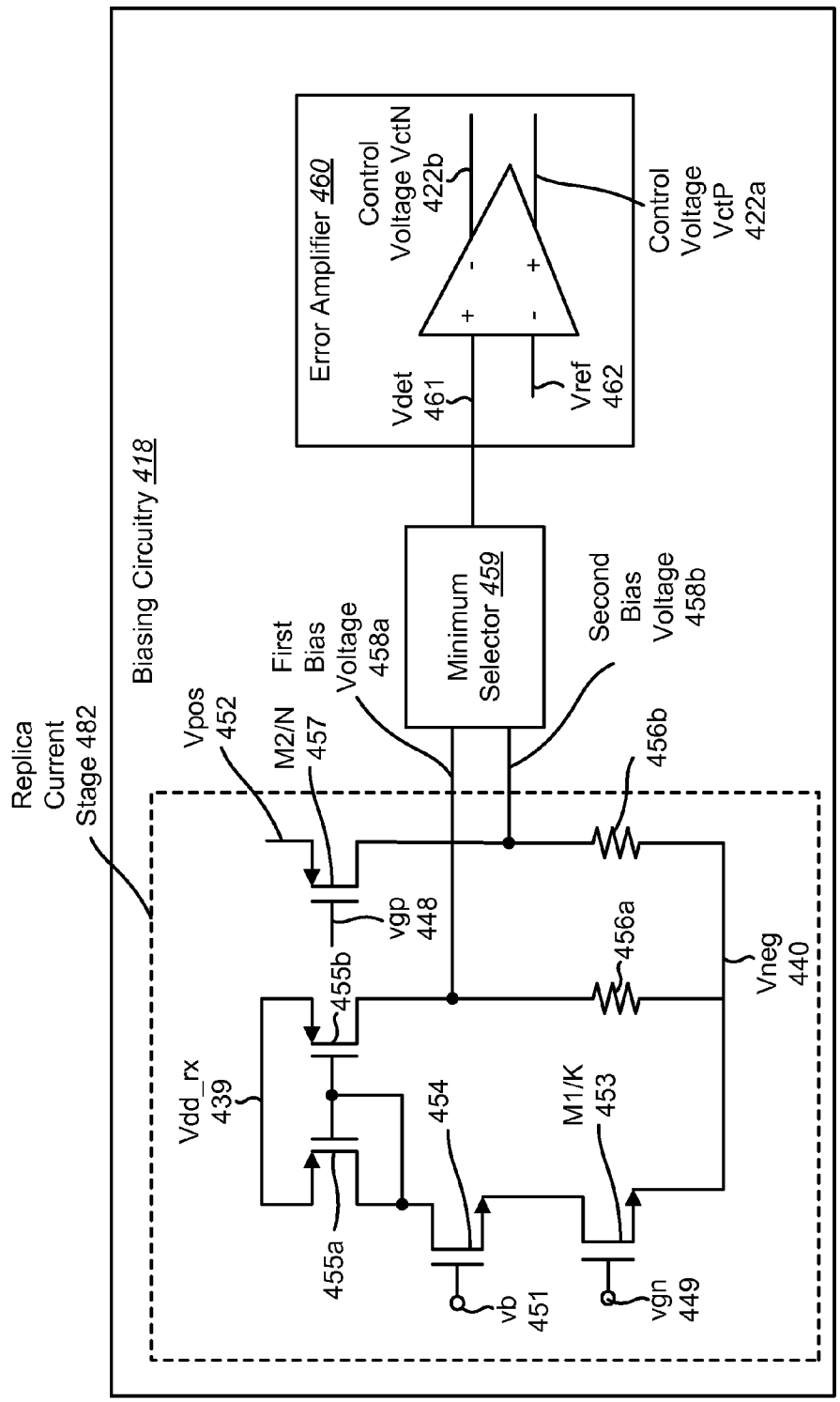
FIG. 4 is a circuit diagram of biasing circuitry for use in the present systems and methods.

FIG. 4 is a circuit diagram of biasing circuitry 418 for use in the present systems and methods. The biasing circuitry 418 of FIG. 4 may be one configuration of the biasing circuitry 118 of FIG. 1. The biasing circuitry 418 may include a replica current stage 482, a minimum selector 459 and an error amplifier 460. The replica current stage may generate a first bias voltage 458*a* and a second bias voltage 458*b*.

The replica current stage 482 may include a first p-channel transistor 455*a*, a second p-channel transistor 455*b*, a p-channel transistor M2/N 457, an n-channel transistor 454 and an n-channel transistor M1/K 453. The size of the p-channel transistor M2/N 457 may be the size of the p-channel transistor M2 347 of the output stage Gm3 316 divided by an integer N. The size of the n-channel transistor M1/K 453 may be the size of the n-channel transistor M1 346 of the output stage Gm3 316 divided by an integer K.

The source of the first p-channel transistor 455a and the source of the second p-channel transistor 455b may each be coupled to the positive rail voltage Vdd_rx 439. The gate of the first p-channel transistor 455a may be coupled to the gate of the second p-channel transistor 455b. The gate of the first p-channel transistor 455a may also be coupled to the drain of the first p-channel transistor 455a. The gate of the first p-channel transistor 455a may further be coupled to the drain of the n-channel transistor 454.

The gate of the n-channel transistor 454 may be coupled to a voltage vb 451. The voltage vb 451 may be an arbitrary voltage used to set the drain voltage of the n-channel transistor M1/K 453. It is desired to set the voltage vb 451 such that the drain voltage of the re-channel transistor M1/K 453 is close to the output voltage at zero signal condition (e.g., at 0 V). The source of the n-channel transistor 454 may be coupled to the drain of the n-channel transistor M1/K 453. The gate of the n-channel transistor M1/K 453 may be coupled to a voltage vgn 449. The voltage vgn 449 may be the voltage vgn 349 of FIG. 3. The source of the re-channel transistor M1/K 453 may be coupled to the variable negative supply rail Vneg 440.

The drain of the second p-channel transistor 455b may be coupled to the variable negative supply voltage Vneg 440 via a resistor 456a. The voltage at the drain of the second p-channel transistor 455b may be the first bias voltage 458a.

The source of the p-channel transistor M2/N 457 may be coupled to a variable positive supply rail Vpos 452. The gate of the p-channel transistor M2/N 457 may be coupled to a voltage vgp 448. The voltage vgp 448 may be the voltage vgp 348 of FIG. 3. The drain of the p-channel transistor M2/N 457 may be coupled to the variable negative supply rail Vneg 440 via a resistor 456b. The voltage at the drain of the p-channel transistor M2/N 457 may be the second bias voltage 458b.

Both the first bias voltage 458a and the second bias voltage 458b may be provided to the minimum selector 459. The minimum selector 459 may output a determined voltage Vdet 461. The determined voltage Vdet 461 may be the average of the first bias voltage 458a and the second bias voltage 458b, if the first bias voltage 458a and the second bias voltage 458b are close (i.e., less than the saturation voltage of the transistors used in the minimum selector 459 (referred to as a minimum selector transistor saturation voltage)). If one of the bias voltages 458 is much larger than the other bias voltage 458 (for example, when a class-AB amplifier is driving high current), the minimum selector 459 may output the smaller bias voltage 458 as the determined voltage Vdet 461. The minimum selector 459 is discussed in additional detail below in relation to FIG. 6.

The determined voltage Vdet 461 may be provided to an error amplifier 460. The error amplifier 460 may compare the selected bias voltage 458 (i.e., the determined voltage Vdet 461) with a reference voltage Vref 462 to set the control voltage VctP 422a and the control voltage VctN 422b based on negative feedback. The error amplifier 460 may thus output the control voltage VctP 422a and the control voltage VctN 422b. The error amplifier 460 is discussed in additional detail below in relation to FIG. 5.

Figure 5:
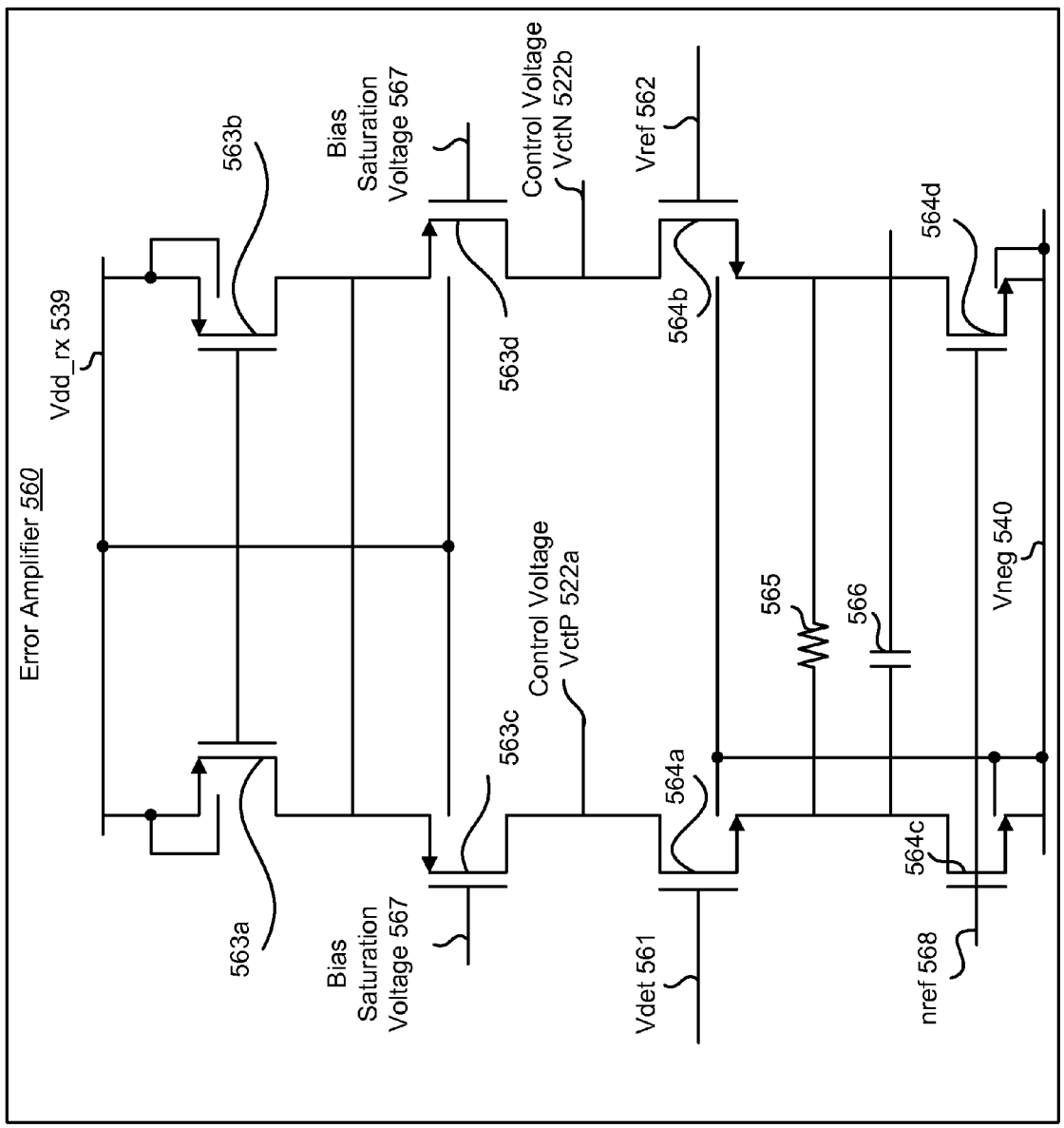
FIG. 5 is a circuit diagram of an error amplifier.

FIG. 5 is a circuit diagram of an error amplifier 560. The error amplifier 560 of FIG. 5 may be one configuration of the error amplifier 460 of FIG. 4. As discussed above, the error amplifier 560 may compare the bias voltage Vdet 561 with a reference voltage Vref 562 to set the control voltages VctP 522a and VctN 522b. The error amplifier 560 may thus control the quiescent current of the output stage Gm3 116 (which is controlled by a differential output). The error amplifier 560 may also control the second stage Gm2 112 bias current (which is controlled by a common mode output via a common mode feedback (CMFB) stage). The error amplifier 560 may be source degenerated to control the transconductance (gm) and the stability of the error amplifier 560 loop.

The error amplifier 560 may include a first p-channel transistor 563a, a second p-channel transistor 563b, a third p-channel transistor 563c, a fourth p-channel transistor 563d, a first n-channel transistor 564a, a second n-channel transistor 564b, a third n-channel transistor 564c and a fourth n-channel transistor 564d. The error amplifier 560 may also include a resistor 565 and a capacitor 566. The body of each of the p-channel transistors 563a-d may be coupled to the positive supply rail Vdd_rx 539. The body of each of the n-channel transistors 564a-d may be coupled to the variable negative supply rail Vneg 540 to bias each of the n-channel transistors 564a-d.

The source of the first p-channel transistor 563a and the source of the second p-channel transistor 563b may each be coupled to the positive supply rail Vdd_rx 539. The gate of the first p-channel transistor 563a may be coupled to the gate of the second p-channel transistor 563b. The drain of the first p-channel transistor 563a may be coupled to the drain of the second p-channel transistor 563b. The drain of the first p-channel transistor 563a may also be coupled to the source of the third p-channel transistor 563c. The drain of the second p-channel transistor 563b may also be coupled to the source of the fourth p-channel transistor 563d.

The gate of the third p-channel transistor 563c and the gate of the fourth p-channel transistor 563d may each be coupled to a bias saturation voltage 567. The bias saturation voltage 657 is a ground voltage (or other voltage) that is used to bias the cascode transistors 563c-d to operate in the saturation region. The drain of the third p-channel transistor 563c may be coupled to the drain of the first n-channel transistor 564a. The voltage at the drain of the third p-channel transistor 563c may be the control voltage VctP 522a. The drain of the fourth p-channel transistor 563d may be coupled to the drain of the second n-channel transistor 564b. The voltage at the drain of the fourth p-channel transistor 563d may be the control voltage VctN 522b.

The gate of the first n-channel transistor 564a may be coupled to the voltage Vdet 561. The voltage Vdet 561 of FIG. 5 may be the voltage Vdet 461 of FIG. 4. The gate of the second n-channel transistor 564b may be coupled to the reference voltage Vref 562. The voltage Vref 562 of FIG. 5 may be the voltage Vref 462 of FIG. 4. The source of the first n-channel transistor 564a may be coupled to source of the second n-channel transistor 564b via the resistor 565. The source of the first n-channel transistor 564a may also be coupled to the source of the second n-channel transistor 564b via the capacitor 566. The source of the first n-channel transistor 564a may further be coupled to the drain of the third n-channel transistor 564c. The source of the second n-channel transistor 564b may be coupled to the drain of the fourth re-channel transistor 564d. The gate of the third n-channel transistor 564c and the gate of the fourth n-channel transistor 564d may each be coupled to a reference signal nref 568. The reference signal nref 568 may be provided from the common mode feedback (CMFB) amplifier that sets the common mode voltage of the control voltage VctP 522a and the control voltage VctP 522b. The source of the third n-channel transistor 564c and the source of the fourth n-channel transistor 564*d* may each be coupled to the variable negative supply rail Vneg 540.

Figure 6:
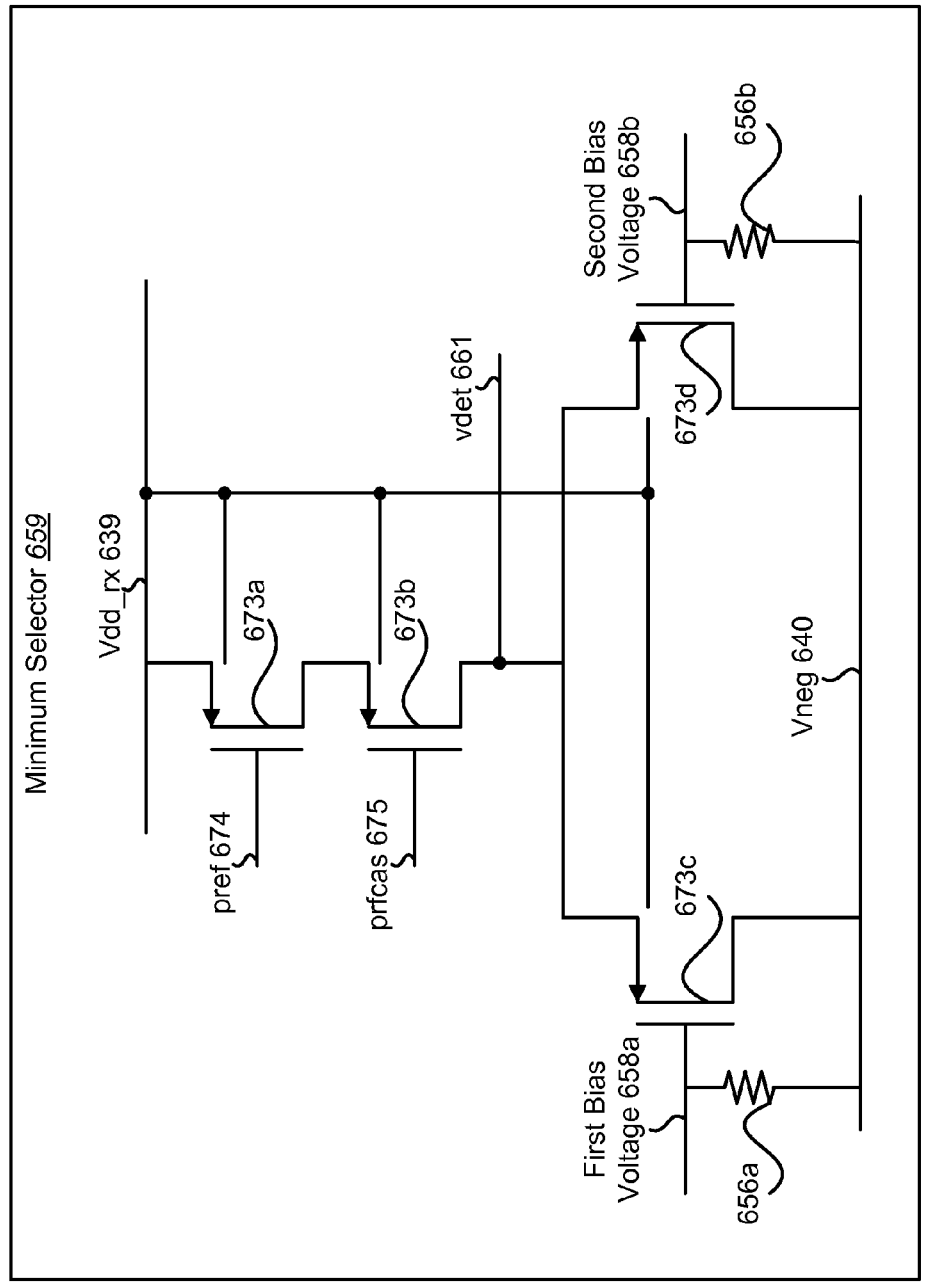
FIG. 6 is a circuit diagram of a minimum selector.

FIG. 6 is a circuit diagram of a minimum selector 659. The minimum selector 659 of FIG. 6 may be one configuration of the minimum selector 459 of FIG. 4. As discussed above, the minimum selector 459 may receive a first bias voltage 658*a* and a second bias voltage 658*b*. The minimum selector 659 may then output an average of the bias voltages 658 (if the bias voltages 658 are close) as the voltage Vdet 661 or the smaller bias voltage 658 (if one bias voltage 658 is much larger than the other bias voltage 658) as the voltage Vdet 661. In other amplifier designs, the minimum selector 659 was embedded in the amplifier and could not be used in complex multi-stage topology.

The minimum selector 659 may include a first p-channel transistor 673*a*, a second p-channel transistor 673*b*, a third p-channel transistor 673*c* and a fourth p-channel transistor 673*d*. The body of each of the p-channel transistors 673*a-d* may be coupled to the positive supply rail Vdd_rx 639 to bias each of the p-channel transistors 673*a-d*. The source of the first p-channel transistor 673*a* may be coupled to the positive supply rail Vdd_rx 639. The gate of the first p-channel transistor 673*a* may receive a voltage pref 674. The drain of the first p-channel transistor 673*a* may be coupled to the source of the second p-channel transistor 673*b*. The gate of the second p-channel transistor 673*b* may receive a voltage prfcas 675. The voltages pref 674 and prfcas 675 may be set such that the p-channel transistors 673 and 673*d* are biased with the proper currents.

The drain of the second p-channel transistor 673*b* may be coupled to the source of the third p-channel transistor 673*c* and to the source of the fourth p-channel transistor 673*d*. The voltage at the drain of the second p-channel transistor 673*b* may be the bias voltage Vdet 661 output by the minimum selector 659. The drain of the third p-channel transistor 673*c* and the drain of the fourth p-channel transistor 673*d* may each be coupled to the variable negative supply rail Vneg 640. The gate of the third p-channel transistor 673*c* may be coupled to the variable negative supply rail Vneg 640*a* via a resistor 656*a* (i.e., the resistor 456*a*). The gate of the third p-channel transistor 673*c* may also be coupled to the first bias voltage 658*a*. The gate of the fourth p-channel transistor 673*d* may be coupled to the variable negative supply rail Vneg 640 via a resistor 656*b* (i.e., the resistor 456*b*). The gate of the fourth p-channel transistor 673*d* may also be coupled to the second bias voltage 658*b*.

Figure 7:
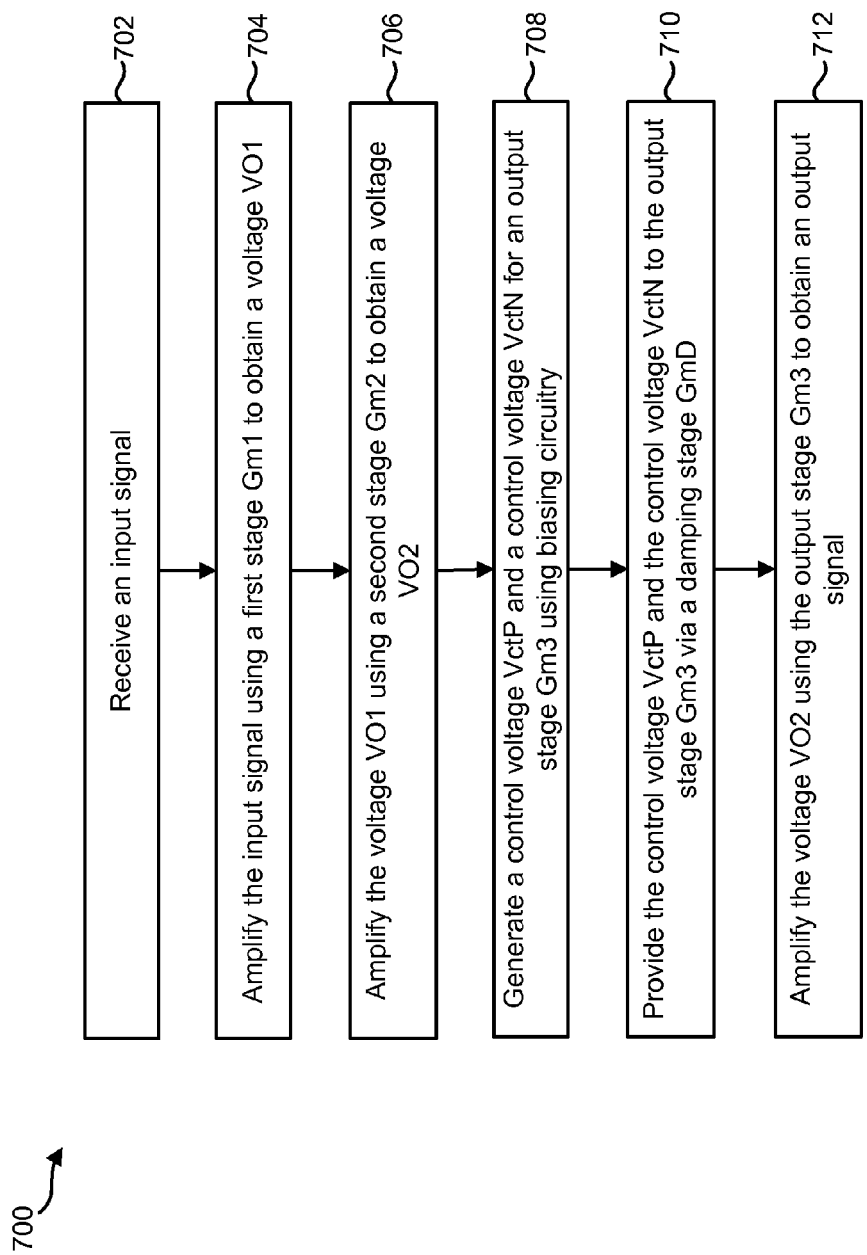
FIG. 7 is a flow diagram of a method for amplification using a low voltage multi-stage amplifier.

FIG. 7 is a flow diagram of a method 700 for amplification using a low voltage multi-stage amplifier 106. The method 700 may be performed by the low voltage multi-stage amplifier 106. The low voltage multi-stage amplifier 106 may receive 702 an input signal 108. The low voltage multi-stage amplifier 106 may amplify 704 the input signal 108 using a first stage Gm1 110 to obtain a voltage VO1 221. The low voltage multi-stage amplifier 106 may amplify 706 the voltage VO1 221 using a second stage Gm2 112 to obtain a voltage VO2 224.

The low voltage multi-stage amplifier 106 may generate 708 a control voltage VctP 322*a* and a control voltage VctN 322*b* for an output stage Gm3 116 using biasing circuitry 118. The low voltage multi-stage amplifier 106 may provide 710 the control voltage VctP 322*a* and the control voltage VctN 322*b* to the output stage Gm3 116 via a damping stage GmD 114. The low voltage multi-stage amplifier 106 may amplify 712 the voltage VO2 224 using the output stage Gm3 116 to obtain an output signal 120.

Figure 8:
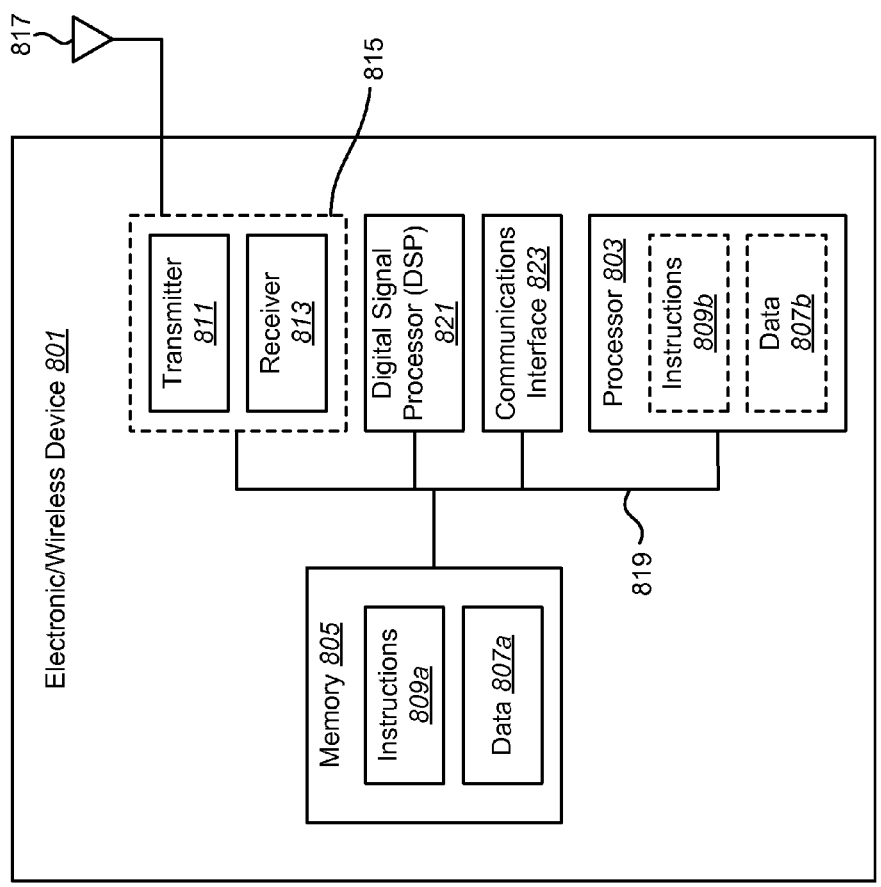
FIG. 8 shows part of a hardware implementation of an electronic device/wireless device that uses a low voltage multi-stage amplifier.

FIG. 8 illustrates certain components that may be included within an electronic device/wireless device 801 that uses a low voltage multi-stage amplifier 106. The electronic device/wireless device 801 may be an access terminal, a mobile station, a wireless communication device, a user equipment (UE), a base station, a Node B, a handheld electronic device, etc. The electronic device/wireless device 801 includes a processor 803. The processor 803 may be a general purpose single- or multi-chip microprocessor (e.g., an ARM), a special purpose microprocessor (e.g., a digital signal processor (DSP)), a microcontroller, a programmable gate array, etc. The processor 803 may be referred to as a central processing unit (CPU). Although just a single processor 803 is shown in the electronic device/wireless device 801 of FIG. 9, in an alternative configuration, a combination of processors (e.g., an ARM and DSP) could be used.

The electronic device/wireless device 801 also includes memory 805. The memory 805 may be any electronic component capable of storing electronic information. The memory 805 may be embodied as random access memory (RAM), read-only memory (ROM), magnetic disk storage media, optical storage media, flash memory devices in RAM, on-board memory included with the processor, EPROM memory, EEPROM memory, registers, and so forth, including combinations thereof.

Data 807*a* and instructions 809*a* may be stored in the memory 805. The instructions 809*a* may be executable by the processor 803 to implement the methods disclosed herein. Executing the instructions 809*a* may involve the use of the data 807*a* that is stored in the memory 805. When the processor 803 executes the instructions 809*a*, various portions of the instructions 809*b* may be loaded onto the processor 803, and various pieces of data 807*b* may be loaded onto the processor 803.

The electronic device/wireless device 801 may also include a transmitter 811 and a receiver 813 to allow transmission and reception of signals to and from the electronic device/wireless device 801. The transmitter 811 and receiver 813 may be collectively referred to as a transceiver 815. An antenna 817 may be electrically coupled to the transceiver 815. The electronic device/wireless device 801 may also include (not shown) multiple transmitters, multiple receivers, multiple transceivers and/or multiple antennas.

The electronic device/wireless device 801 may include a digital signal processor (DSP) 821. The electronic device/wireless device 801 may also include a communications interface 823. The communications interface 823 may allow a user to interact with the electronic device/wireless device 801.

The various components of the electronic device/wireless device 801 may be coupled together by one or more buses, which may include a power bus, a control signal bus, a status signal bus, a data bus, etc. For the sake of clarity, the various buses are illustrated in FIG. 9 as a bus system 819.

The techniques described herein may be used for various communication systems, including communication systems that are based on an orthogonal multiplexing scheme. Examples of such communication systems include Orthogonal Frequency Division Multiple Access (OFDMA) systems, Single-Carrier Frequency Division Multiple Access (SC-FDMA) systems, and so forth. An OFDMA system utilizes orthogonal frequency division multiplexing (OFDM), which is a modulation technique that partitions the overall system bandwidth into multiple orthogonal sub-carriers. These sub-carriers may also be called tones, bins, etc. With OFDM, each sub-carrier may be independently modulated with data. An SC-FDMA system may utilize interleaved FDMA (IF-DMA) to transmit on sub-carriers that are distributed across the system bandwidth, localized FDMA (LFDMA) to transmit on a block of adjacent sub-carriers, or enhanced FDMA (EFDMA) to transmit on multiple blocks of adjacent sub-carriers. In general, modulation symbols are sent in the frequency domain with OFDM and in the time domain with SC-FDMA.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, subroutines, functions, procedures, etc. "Instructions" and "code" may comprise a single computer-readable statement or many computer-readable statements.

The functions described herein may be implemented in software or firmware being executed by hardware. The functions may be stored as one or more instructions on a computer-readable medium. The terms "computer-readable medium" or "computer-program product" refers to any tangible storage medium that can be accessed by a computer or a processor. By way of example, and not limitation, a computer-readable medium may include RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIG. 7, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read-only memory (ROM), a physical storage medium such as a compact disc (CD) or floppy disk, etc.), such that a device may obtain the various methods upon coupling or providing the storage means to the device.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A low voltage multi-stage amplifier, comprising:
   one or more prior stages;
   a supply stage;
   an output stage, wherein the supply stage supplies the output stage; and
   biasing circuitry that sets quiescent current for proper operation of the output stage via the supply stage, wherein the biasing circuitry comprises a replica current stage, a minimum selector and an error amplifier.

2. The low voltage multi-stage amplifier of claim 1, wherein the supply stage also operates as a damping stage.

3. The low voltage multi-stage amplifier of claim 1, wherein the replica current stage provides a first bias voltage and a second bias voltage to the minimum selector, wherein the minimum selector provides a determined voltage to the error amplifier, and wherein the error amplifier controls the supply stage that sets a quiescent current of the output stage.

4. The low voltage multi-stage amplifier of claim 3, wherein the determined voltage is an average of the first bias voltage and the second bias voltage if the first bias voltage and the second bias voltage are within a minimum selector transistor saturation voltage of each other, and wherein the determined voltage is the smaller of the first bias voltage and the second bias voltage if the first bias voltage and the second bias voltage are not within the minimum selector transistor saturation voltage of each other.

5. The low voltage multi-stage amplifier of claim 3, wherein the error amplifier outputs a first control voltage and a second control voltage to the supply stage.

6. The low voltage multi-stage amplifier of claim 1, wherein the one or more prior stages comprises a first stage and a second stage, wherein the first stage receives an input signal, wherein an output of the first stage is coupled to the second stage, wherein an output of the second stage is coupled to the output stage, and wherein the output stage outputs an output signal.

7. The low voltage multi-stage amplifier of claim 6, wherein additional bias current is not needed to support the supply stage since current in the second stage is recycled.

8. The low voltage multi-stage amplifier of claim 1, wherein the low voltage multi-stage amplifier is a class-G amplifier.

9. The low voltage multi-stage amplifier of claim 1, wherein the low voltage multi-stage amplifier is a class-H amplifier.

10. The low voltage multi-stage amplifier of claim 1, wherein the low voltage multi-stage amplifier is configured to match supply voltages of the output stage to an output signal of the output stage.

11. The low voltage multi-stage amplifier of claim 1, wherein the output stage operates with supply voltages of +/−0.45 volts.

12. The low voltage multi-stage amplifier of claim 1, wherein the output stage comprises an n-channel transistor and a p-channel transistor.

13. The low voltage multi-stage amplifier of claim 12, wherein the n-channel transistor is coupled to a first voltage and the p-channel transistor is coupled to a second voltage.

14. The low voltage multi-stage amplifier of claim 13, wherein first voltage and the second voltage are coupled to the biasing circuitry.

15. The low voltage multi-stage amplifier of claim 1, wherein the output stage comprises a first transistor and the supply stage comprises a second transistor.

16. The low voltage multi-stage amplifier of claim 15, wherein the output stage operates with a supply voltage as low as a sum of a threshold voltage of the first transistor in the output stage and a saturation voltage of the second transistor of the supply stage.

17. The low voltage multi-stage amplifier of claim 15, wherein the first transistor is a p-channel transistor and wherein the second transistor is an n-channel transistor.

18. The low voltage multi-stage amplifier of claim 17, wherein a source of the first transistor is coupled to a variable positive supply voltage, wherein a gate of the first transistor is coupled to a drain of the second transistor, and wherein a source of the second transistor is coupled to a variable negative supply voltage.

19. A method for amplification, the method comprising:
obtaining an input signal; and
amplifying the input signal using a low voltage multi-stage amplifier that comprises:
one or more prior stages;
a supply stage;
an output stage, wherein the supply stage supplies the output stage; and
biasing circuitry that sets quiescent current for proper operation of the output stage via the supply stage, wherein the biasing circuitry comprises a replica current stage, a minimum selector and an error amplifier.

20. The method of claim 19, wherein the supply stage also operates as a damping stage.

21. The method of claim 19, wherein the replica current stage provides a first bias voltage and a second bias voltage to the minimum selector, wherein the minimum selector provides a determined voltage to the error amplifier, and wherein the error amplifier controls the supply stage that sets a quiescent current of the output stage.

22. The method of claim 21, wherein the determined voltage is an average of the first bias voltage and the second bias voltage if the first bias voltage and the second bias voltage are within a minimum selector transistor saturation voltage of each other, and wherein the determined voltage is the smaller of the first bias voltage and the second bias voltage if the first bias voltage and the second bias voltage are not within the minimum selector transistor saturation voltage of each other.

23. The method of claim 21, wherein the error amplifier outputs a first control voltage and a second control voltage to the supply stage.

24. The method of claim 19, wherein the output stage comprises a first transistor and the supply stage comprises a second transistor, and wherein the first transistor is a p-channel transistor and wherein the second transistor is an n-channel transistor.

25. The method of claim 24, wherein a source of the first transistor is coupled to a variable positive supply voltage, wherein a gate of the first transistor is coupled to a drain of the second transistor, and wherein a source of the second transistor is coupled to a variable negative supply voltage.

26. The method of claim 19, wherein the one or more prior stages comprises a first stage and a second stage, wherein the first stage receives an input signal, wherein an output of the first stage is coupled to the second stage, wherein an output of the second stage is coupled to the output stage, and wherein the output stage outputs an output signal.

27. The method of claim 26, wherein additional bias current is not needed to support the supply stage since current in the second stage is recycled.

28. The method of claim 19, wherein the low voltage multi-stage amplifier is a class-G amplifier.

29. The method of claim 19, wherein the low voltage multi-stage amplifier is a class-H amplifier.

30. The method of claim 19, wherein the low voltage multi-stage amplifier is configured to match supply voltages of the output stage to an output signal of the output stage.

31. The method of claim 19, wherein the output stage operates with supply voltages of +/−0.45 volts.

32. The method of claim 19, wherein the output stage comprises an n-channel transistor and a p-channel transistor.

33. The method of claim 32, further comprising providing a first voltage to the n-channel transistor and providing a second voltage to the p-channel transistor.

34. An apparatus, comprising:
means for obtaining an input signal; and
means for amplifying the input signal, wherein the means for amplifying the input signal comprise:
one or more prior stages;
a supply stage;
an output stage, wherein the supply stage supplies the output stage; and
biasing circuitry that sets quiescent current for proper operation of the output stage via the supply stage, wherein the biasing circuitry comprises a replica current stage, a minimum selector and an error amplifier.

35. The apparatus of claim 34, wherein the apparatus is configured to match supply voltages of an output stage to an output signal of the output stage.

36. The apparatus of claim 34, wherein the output stage operates with supply voltages of +/−0.45 volts.

37. The apparatus of claim 34, wherein the output stage comprises an n-channel transistor and a p-channel transistor.

38. A computer-program product configured for amplifying an input signal, the computer-program product comprising a non-transitory computer-readable medium having instructions thereon, the instructions comprising:
- code for causing a low voltage multi-stage amplifier to obtain an input signal; and
- code for causing the low voltage multi-stage amplifier to amplify the input signal,
  - wherein the low voltage multi-stage amplifier comprises:
  - one or more prior stages;
  - a supply stage;
  - an output stage, wherein the supply stage supplies the output stage; and
  - biasing circuitry that sets quiescent current for proper operation of the output stage via the supply stage, wherein the biasing circuitry comprises a replica current stage, a minimum selector and an error amplifier.

39. The computer-program product of claim 38, wherein the low voltage multi-stage amplifier is configured to match supply voltages of the output stage to an output signal of the output stage.

40. The computer-program product of claim 38, wherein the output stage operates with supply voltages of +/−0.45 volts.

* * * * *